(12) United States Patent
Choi

(10) Patent No.: US 10,189,947 B2
(45) Date of Patent: Jan. 29, 2019

(54) COMPOSITION OF ANTI-REFLECTIVE HARDMASK

(71) Applicant: Sang Jun Choi, Seoul (KR)

(72) Inventor: Sang Jun Choi, Seoul (KR)

( * ) Notice: Subject to any disclaimer, the term of this patent is extended or adjusted under 35 U.S.C. 154(b) by 127 days.

(21) Appl. No.: 15/400,003

(22) Filed: Jan. 6, 2017

(65) Prior Publication Data
US 2017/0198096 A1    Jul. 13, 2017

(30) Foreign Application Priority Data

Jan. 11, 2016 (KR) .......................... 10-2016-0003275

(51) Int. Cl.
| C09D 179/04 | (2006.01) |
| C08G 73/06 | (2006.01) |
| G03F 7/09 | (2006.01) |
| G03F 7/16 | (2006.01) |
| G03F 7/20 | (2006.01) |
| G03F 7/32 | (2006.01) |

(52) U.S. Cl.
CPC ....... *C08G 73/0672* (2013.01); *C09D 179/04* (2013.01); *G03F 7/091* (2013.01); *G03F 7/162* (2013.01); *G03F 7/168* (2013.01); *G03F 7/2002* (2013.01); *G03F 7/322* (2013.01)

(58) Field of Classification Search
None
See application file for complete search history.

(56) References Cited

U.S. PATENT DOCUMENTS

| 9,263,285 | B2 | 2/2016 | Shinjo | |
| 9,343,324 | B2 | 5/2016 | Shinjo | |
| 9,857,686 | B2* | 1/2018 | Ogihara | C09D 161/22 |
| 2006/0019195 | A1* | 1/2006 | Hatakeyama | G03F 7/091 |
| | | | | 430/271.1 |
| 2006/0073357 | A1* | 4/2006 | Brunner | C08G 61/123 |
| | | | | 428/690 |
| 2010/0099044 | A1* | 4/2010 | Hatakeyama | G03F 7/091 |
| | | | | 430/285.1 |
| 2010/0104977 | A1* | 4/2010 | Hatakeyama | C08G 61/02 |
| | | | | 430/271.1 |
| 2010/0151382 | A1* | 6/2010 | Hatakeyama | G03F 7/094 |
| | | | | 430/270.1 |
| 2012/0077345 | A1* | 3/2012 | Saito | C08G 12/26 |
| | | | | 438/703 |
| 2012/0252218 | A1* | 10/2012 | Kori | C07C 39/17 |
| | | | | 438/703 |
| 2013/0189533 | A1* | 7/2013 | Okuyama | G03F 7/091 |
| | | | | 428/524 |
| 2014/0363768 | A1* | 12/2014 | Kinsho | G03F 7/091 |
| | | | | 430/270.1 |
| 2015/0187566 | A1 | 7/2015 | Park et al. | |
| 2016/0008844 | A1* | 1/2016 | Hatakeyama | G03F 7/091 |
| | | | | 216/47 |
| 2016/0111287 | A1* | 4/2016 | Hatakeyama | H01L 21/0332 |
| | | | | 438/703 |
| 2016/0126088 | A1* | 5/2016 | Kim | G03F 7/40 |
| | | | | 257/618 |

FOREIGN PATENT DOCUMENTS

| KR | 10-2008-0107210 | 12/2008 |
| KR | 10-2009-0120827 | 11/2009 |
| KR | 10-2010-0044111 | 4/2010 |
| KR | 10-2013-0130005 | 11/2013 |
| KR | 10-2014-0039423 | 4/2014 |
| KR | 10-2014-0051931 | 5/2014 |
| KR | 10-2015-0079199 | 7/2015 |
| KR | 10-1572594 | 11/2015 |
| KR | 10-2016-0112847 | 9/2016 |
| WO | 2013-100365 | 7/2013 |

OTHER PUBLICATIONS

Machine translation of KR 101572594, translation generated Jul. 2018, 30 pages (Year: 2018).*

* cited by examiner

*Primary Examiner* — Robert S Loewe
(74) *Attorney, Agent, or Firm* — Lex IP Meister, PLLC

(57) ABSTRACT

An anti-reflective hardmask composition is provided. In an exemplary embodiment, the anti-reflective hardmask composition includes (a) a carbazole derivative polymer represented by the following Formula 1 or a polymer blend comprising the carbazole derivative polymer, and (b) an organic solvent:

[Formula 1]

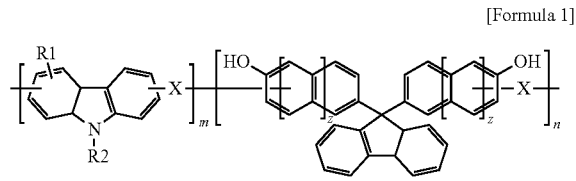

18 Claims, No Drawings

COMPOSITION OF ANTI-REFLECTIVE HARDMASK

CROSS-REFERENCE TO RELATED APPLICATION

This application claims priority to and the benefit of Korean Patent Application No. 10-2016-0003275 filed on Jan. 11, 2016 in the Korean Intellectual Property Office, and all the benefits accruing therefrom under 35 U.S.C. 119, the contents of which in its entirety are herein incorporated by reference.

BACKGROUND

1. Field

The present invention relates to a hardmask composition having an anti-reflective property advantageously used for a lithographic process, a carbazole-based aromatic ring containing polymer having high absorbance in the UV region, and a hardmask composition including the polymer.

2. Description of the Related Art

Recently, as the semiconductor industry has gradually demanded ultra-fine techniques, effective lithographic techniques are essentially required to achieve such ultra-fine techniques. Particularly, there is an increasing demand for a new material that can be applied to a hardmask process, which is essential to the ultra-fine technique, such as an etching process.

A hardmask layer generally serves as an intermediate layer for transferring a fine pattern of a photoresist to an underlying substrate layer through a selective etching process. Accordingly, the hardmask layer is required to exhibit characteristics, such as chemical resistance, heat resistance, etching resistance or the like, so as to withstand multiple etching processes. An amorphous carbon layer (ACL) formed by chemical vapor deposition (CVD) has been used as one of conventional hardmask layers. However, it is quite inconvenient to use the conventional hardmask layer due to its disadvantages, such as a need for investment in high-cost equipment, particles formed during a process, or a problem arising in photo-alignment caused by an optically opaque material layer.

Recently, spin-on hardmasks formed by a spin-on coating method, instead of chemical vapor deposition, have been introduced. In order to adopt the spin-on coating method, it is necessary to form a hardmask composition using an organic polymer material having dissolubility in a solvent. In addition, it is necessary to minimize reflectivity between a resist and an underlying layer, which is an important feature required for a hardmask. It is also necessary to form an organic polymer coating having etching resistance. More recently, materials that can be applied to a semiconductor lithographic process while satisfying characteristics of such an organic hardmask material layer have been introduced (see, for example, Korean Patent Publication No. 10-2009-0120827, Korean Patent Publication No. 10-2008-0107210, and International Patent Publication No. WO 2013100365 A1). These hardmask materials are synthesized from copolymers having appropriate polymer molecular weights using conventional phenol resin preparation methods employing hydroxypyrene.

However, as the semiconductor lithographic process has gradually developed to an ultra-finer process, it became quite difficult for the organic hardmask material to serve as a mask during an etching process due to its poor etching selectivity, compared to the conventional inorganic hardmask material. Therefore, there is a pressing need to propose organic hardmask materials that are more optimized to the etching process.

SUMMARY

Embodiments of the present invention provide a hardmask composition having high etching selectivity and sufficiently high resistance to multi etching.

Embodiments of the present invention provide a hardmask composition which can minimize reflectivity between a resist and an underlying layer to be used in performing a lithographic process.

According to embodiments of the present invention, there is provided an anti-reflective hardmask composition including (a) a carbazole derivative polymer represented by the following Formula 1 or a polymer blend comprising the carbazole derivative polymer, and (b) an organic solvent:

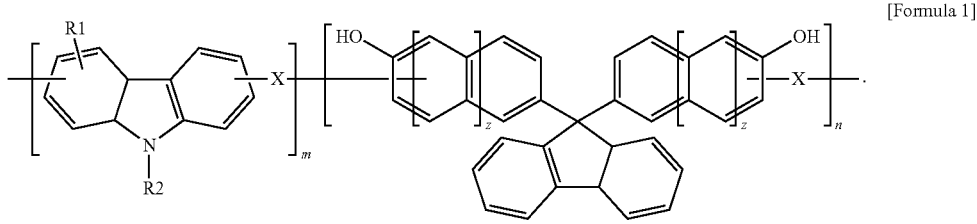

[Formula 1]

where R1 is hydrogen or an alkyl group on an aromatic ring selected from the group consisting of the following substituents, R2 is an alkyl group on an aromatic ring selected from the group consisting of the following substituents, and R1 and R2 may be the same or different:

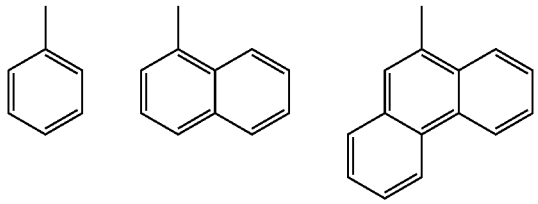

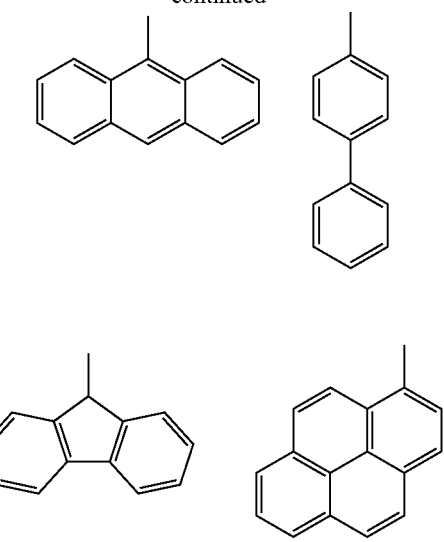
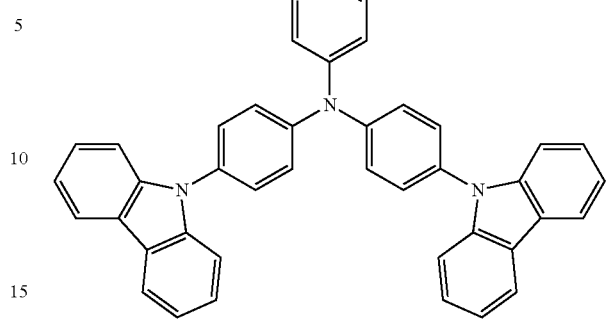
where X is at least one selected from the following substituents:
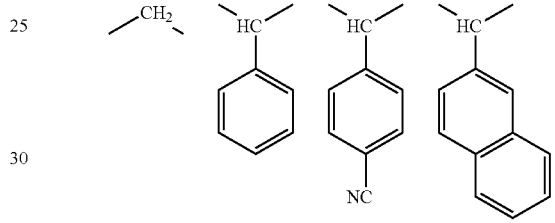
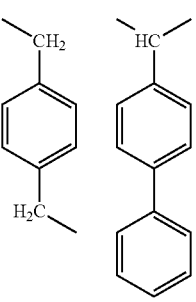
where Z is an integer of 0 or 1,
m/(m+n) equals to a value in the range of between 0.1 and 0.8, and
a weight average molecular weight (Mw) of the polymer is between 1,000 and 30,000.
In embodiments of the present invention, R1 may be hydrogen,
R2 may be at least one selected from the group consisting of the following substituents:
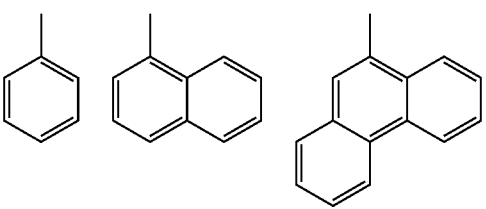
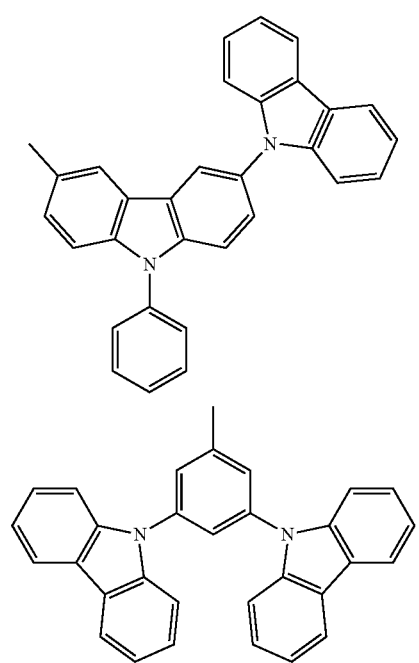

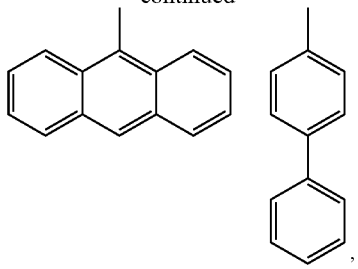

X may be one selected from the group consisting of the following substituents:

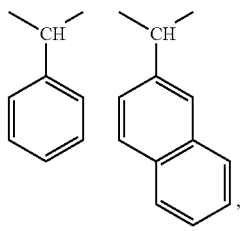

and

Z may be 0.

In embodiments of the present invention, R1 may be hydrogen,

R2 may be at least one selected from the group consisting of the following substituents:

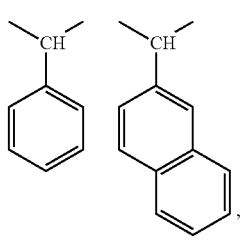

X may be one selected from the group consisting of the following substituents:

and

Z may be 1.

In embodiments of the present invention, X may be represented by:

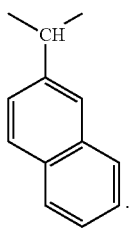

In embodiments of the present invention, the hardmask composition may further include a crosslinker, and an acid catalyst.

In embodiments of the present invention, the hardmask composition may include (a) 1 to 30% by weight of a polymer synthesized from the carbazole derivative or a polymer blend comprising the polymer, (b) 0.1 to 5% by weight of a crosslinker, (c) 0.001 to 0.05% by weight of an acid catalyst, and (d) a balance amount of an organic solvent, based on the total weight of the hardmask composition.

In embodiments of the present invention, the crosslinker may be at least one selected from the group consisting of a melamine resin, an amino resin, a glycoluril compound and a bis epoxy compound.

In embodiments of the present invention, the acid catalyst may be at least one selected from the group consisting of p-toluenesulfonic acid monohydrate, pyridinium p-toluene sulfonate, 2,4,4,6-tetrabromocyclohexadienone, benzoin tosylate, 2-nitrobenzyl tosylate and alkyl esters of organic sulfonic acid.

Since the anti-reflective hardmask composition according to the present invention has higher etching selectivity than the conventional organic hardmask during a lithographic process, it exhibits sufficiently high resistance to multi etching, thereby providing a lithographic structure demonstrating an excellent pattern evaluation result.

In addition, the anti-reflective hardmask composition according to the present invention can be used to form a film having an refractive index and absorbance suitable for use as an anti-reflective coating in the deep UV region (e.g., ArF (193 nm), KrF (248 nm), etc.), thereby minimizing reflectivity between a resist and an underlying layer.

DETAILED DESCRIPTION

The present invention provides an anti-reflective hardmask composition comprising (a) a carbazole derivative polymer represented by the following Formula 1 or a polymer blend comprising the carbazole derivative polymer, and (b) an organic solvent:

[Formula 1]

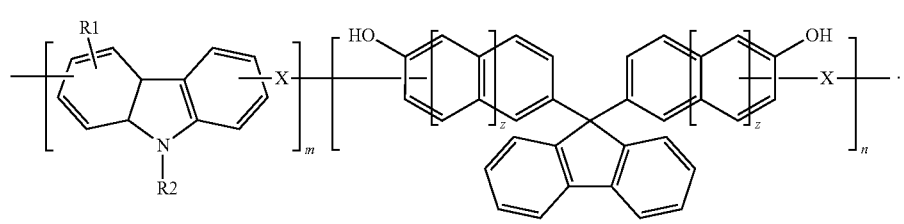

where R1 or R2 of the carbazole derivative may be hydrogen or an alkyl group on an aromatic ring and R1 and R2 may be the same or different.

In Formula 1, R1 is hydrogen or an alkyl group on an aromatic ring selected from the group consisting of the following substituents, R2 is an alkyl group on an aromatic ring selected from the group consisting of the following substituents, and R1 and R2 may be the same or different:

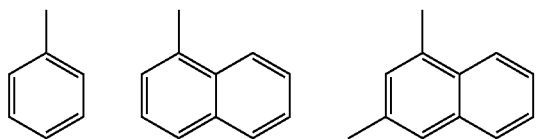

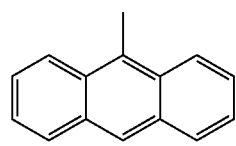

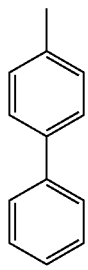

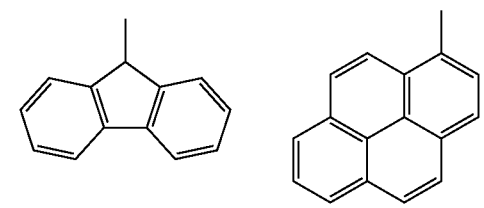

-continued

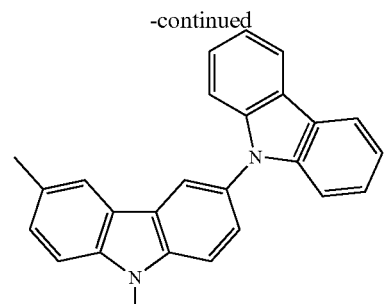

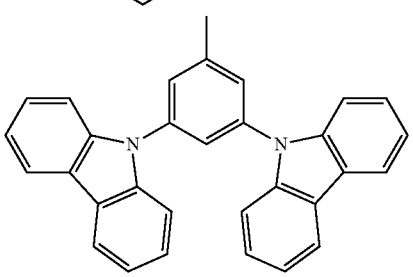

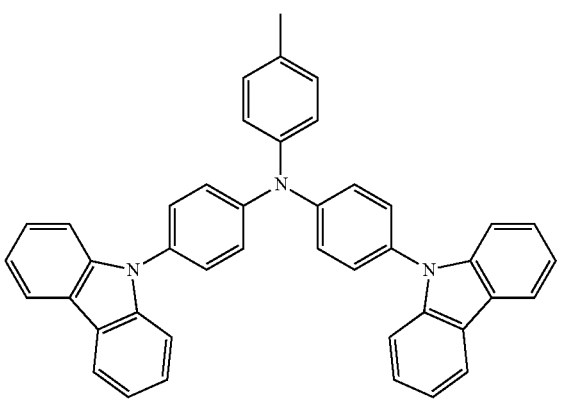

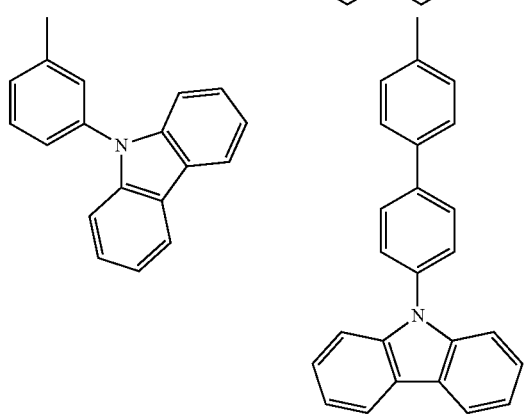

where X is a linkage group including co-monomer components capable of carrying out a one-to-one polymerization reaction between monomers of carbazole derivatives and fluorene monomers typically in the presence of an acid catalyst.

X generally includes aldehyde monomers, such as para-formaldehyde, benzaldehyde or nathtyaldehyde, or di-methoxy or di-ethyoxy containing monomers, and are synthesized by reacting with the carbazole derivatives in presence of the acid catalyst. Examples of X include:

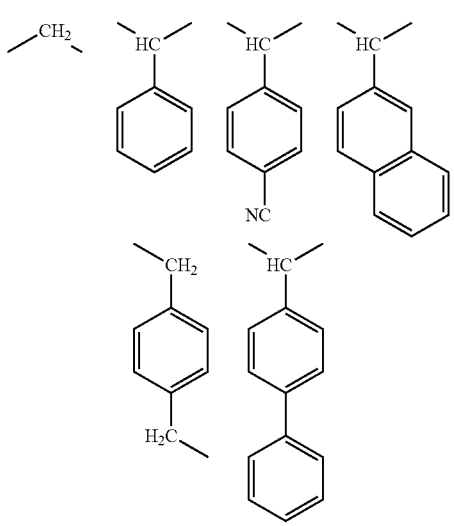

In addition, Z of the fluorene monomer is 0 or 1 and positions of hydroxy (OH) groups may not be limited but may vary.

Here, m/(m+n) equals to a value in the range of between 0.1 and 0.8, and a weight average molecular weight (Mw) of the polymer is between 1,000 and 30,000, preferably between 2,000 and 5,000.

Meanwhile, in order to form a hardmask composition, the carbazole-based aromatic ring containing polymer (a) is preferably used in an amount of 1 to 30% by weight relative to 100% by weight of the organic solvent (b). When the amount of the carbazole-based aromatic ring containing polymer used is less than 1% by weight or exceeds 30% by weight, a desired coating thickness is not attained, thus making it difficult to accurately regulate the thickness of a coating.

The kind of the organic solvent (b) is not particularly restricted so long as the organic solvent (b) has a sufficiently high dissolubility for the aromatic ring-containing polymer (a). Examples of suitable organic solvents may include propylene glycol monomethyl ether acetate (PGMEA), clohexanone and ethyl lactate.

In addition, the anti-reflective hardmask composition according to the present invention may further include: (c) a crosslinker; and (d) an acid catalyst.

The crosslinker (c) used in the hardmask composition according to the present invention is preferably capable of crosslinking repeating units of the polymer in a reaction catalyzed by a generated acid under heating, and the acid catalyst (d) is preferably a thermally activated acid catalyst. The crosslinker (c) used in the hardmask composition according to the present invention is not particularly restricted so long as it can react with a hydroxyl group in the aromatic ring-containing polymer (a) in a catalytically functionalized manner by the generated acid. Specific examples of the crosslinker (c) may include etherified amino resins, such as methylated or butylated melamine resins (e.g., N-methoxymethyl-melamine resins or N-butoxymethyl-melamine resins), methylated or butylated urea resins, (e.g., Cymel U-65 resins and UFR 80 resins), glycoluril compounds (e.g., Powderlink 1174), or bisepoxy compounds (e.g., 2,6-bis(hydroxymethyl)-p-cresol).

As the acid catalyst (c) used in the hardmask composition of the present invention, an organic acid, such as p-toluenesulfonic acid monohydrate, may be used. For improved storage stability, a thermal acid generator (TAG) compound may also be used as the acid catalyst (c). The TAG is a compound that generates an acid upon thermal treatment. Examples of preferred TAGs include pyridinium p-toluene sulfonate, 2,4,4,6-tetrabromocyclohexadienone, benzoin tosylate, 2-nitrobenzyl tosylate and alkyl esters of organic sulfonic acids.

Therefore, when the final hardmask composition of the present invention further includes: (c) a crosslinker; and (d) an acid catalyst, the hardmask composition according to the present invention may include: (a) the polymer synthesized from the carbazole derivative or the polymer blend comprising the polymer used in an amount of 1 to 30% by weight, preferably 3 to 15% by weight; (c) the crosslinker used in an amount of 0.1 to 5% by weight, preferably 0.1 to 3% by weight; (d) the acid catalyst used in an amount of 0.001 to 0.05% by weight, preferably 0.001 to 0.03% by weight; and (d) the organic solvent used in a balance amount, preferably 75 to 98% by weight, based on the total weight of the hardmask composition.

Here, when the amount of the aromatic ring-containing polymer is less than 1% by weight or exceeds 30% by weight, a desired coating thickness is not attained, thus making it difficult to accurately regulate the thickness of a coating.

In addition, when the crosslinker is used in an amount of less than 0.1% by weight, satisfactory crosslinking characteristics may not be demonstrated. Meanwhile, when the crosslinker is used in an amount of greater than 5% by weight, the excess crosslinker may bring about a variation in the optical property of a coating.

Further, when the acid catalyst is used in an amount of less than 0.001% by weight, unsatisfactory crosslinking characteristics may be demonstrated. Meanwhile, when the acid catalyst is used in an amount of greater than 0.05% by weight, the excess acid catalyst may increase acidity, thus adversely affect storage stability of the hardmask composition.

Hereinafter, the present invention will be described in greater detail through the following Examples and Comparative Examples, but it will be understood that the Examples and Comparative Examples are provided just by way of illustration but should not be taken as a limitation upon the scope of the invention.

Preparation Example 1: Synthesis of Carbazole-Based Ring Polymer

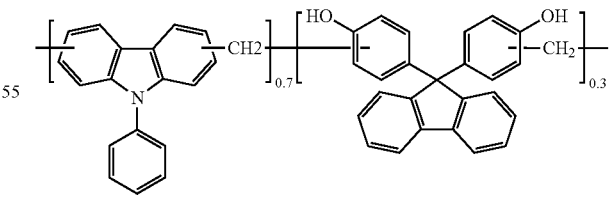

17 g (70 mmol) of 9-phenylcarbazole, 3.2 g (100 mmol) of paraformaldehyde, and 11 g (30 mmol) of 9,9-bis(4-hydroxyphenyl) fluorene were added to a 250-ml round bottom flask and thoroughly dissolved in 75 g of propylene glycol monomethyl ether acetate (PGMEA) at a temperature of 60° C., followed by adding 1 g of an undiluted sulfuric acid solution thereto.

While carrying out a polymerization reaction with the reactor maintained at a temperature of about 120° C. for about 12 hours, molecular weights of the reaction mixture were measured by gel permeation chromatography (GPC) in the middle of the polymerization reaction.

After completing the polymerization reaction, the polymerization product was dropped into a 10-fold excess co-solvent of methanol and water (9:1), the obtained precipitate was again dissolved in an appropriate amount of PGMEA followed by dropping the resultant product into an excess co-solvent of ethanol and water (9:1) for precipitation. The obtained precipitate was finally precipitated in excess methanol.

The solid produced after the reaction was dried in a vacuum oven maintained at about 50° C. for about 20 hours, yielding the polymer having a weight average molecular weight (Mw) of 2,600.

Preparation Example 2: Synthesis of Carbazole-Based Ring Polymer

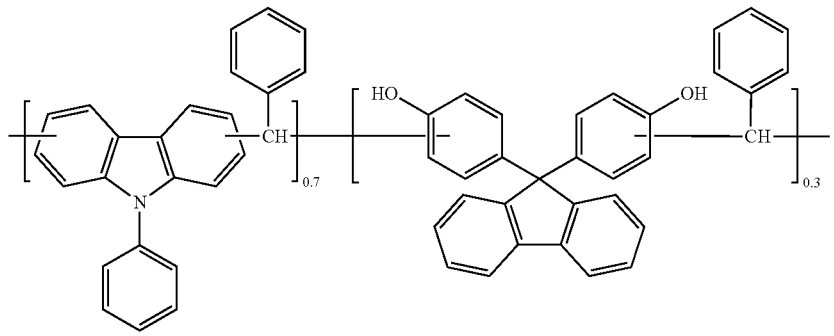

17 g (70 mmol) of 9-phenylcarbazole, 11 g (100 mmol) of benzaldehyde, and 11 g (30 mmol) of 9,9-bishydroxyphenyl fluorene were dissolved in 93 g of PGMEA, followed by adding 1 g of an undiluted sulfuric acid solution thereto.

After a polymerization reaction was carried out in the same manner as in Preparation Example 1, a polymer was purified and dried in a vacuum oven, yielding the polymer having a weight average molecular weight (Mw) of 2,800.

Preparation Example 3: Synthesis of Carbazole-Based Ring Polymer

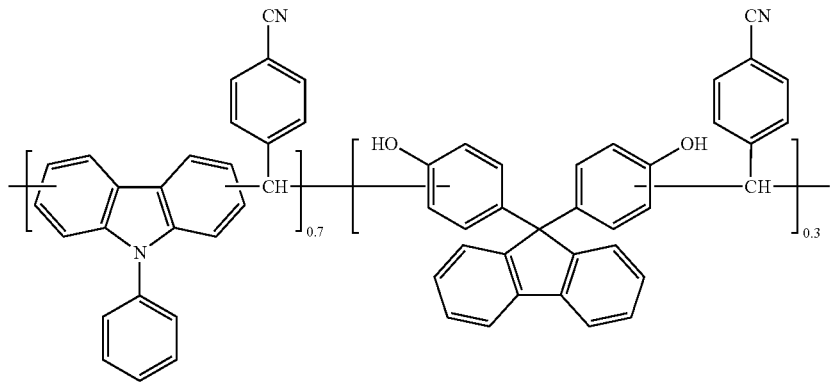

17 g (70 mmol) of 9-phenyl carbazole, 13.5 g (100 mmol) of 4-cyanobenzaldehyde, and 11 g (30 mmol) of 9,9-bishydroxyphenyl fluorene were dissolved in 97 g of PGMEA, followed by adding 1 g of an undiluted sulfuric acid solution thereto.

After a polymerization reaction was carried out in the same manner as in Preparation Example 1, a polymer was then purified and dried in a vacuum oven, yielding the polymer having a weight average molecular weight (Mw) of 3,100.

Preparation Example 4: Synthesis of Carbazole-Based Ring Polymer

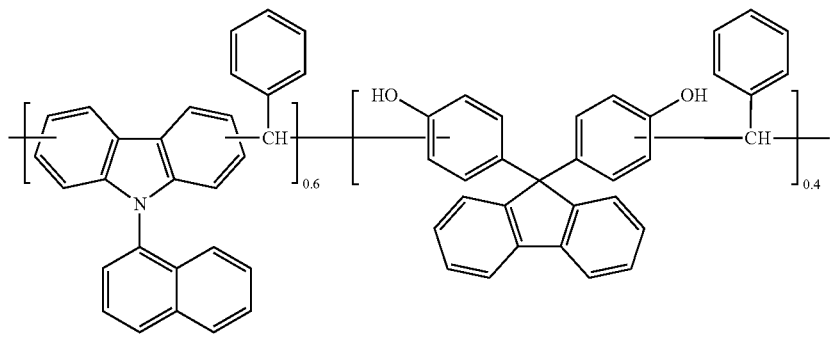

17 g (60 mmol) of 9-(9-naphtyl)carbazole, 11 g (100 mmol) of benzaldehyde, and 14 g (40 mmol) of 9,9-bishydroxyphenyl fluorene were dissolved in 102 g of PGMEA, followed by adding 1 g of an undiluted sulfuric acid solution thereto.

After a polymerization reaction was carried out in the same manner as in Preparation Example 1, a polymer was then purified and dried in a vacuum oven, yielding the polymer having a weight average molecular weight (Mw) of 2,700.

Preparation Example 5: Synthesis of Carbazole-Based Ring Polymer 22.4 g (70 mmol) of 9-(4-biphenyl)carbazole, 11 g (100 mmol) of benzaldehyde, and 11 g (30 mmol) of 9,9-bishydroxyphenyl fluorene were dissolved in 106 g of PGMEA, followed by adding 1 g of an undiluted sulfuric acid solution thereto.

After a polymerization reaction was carried out in the same manner as in Preparation Example 1, a polymer was then purified and dried in a vacuum oven, yielding the polymer having a weight average molecular weight (Mw) of 2,800.

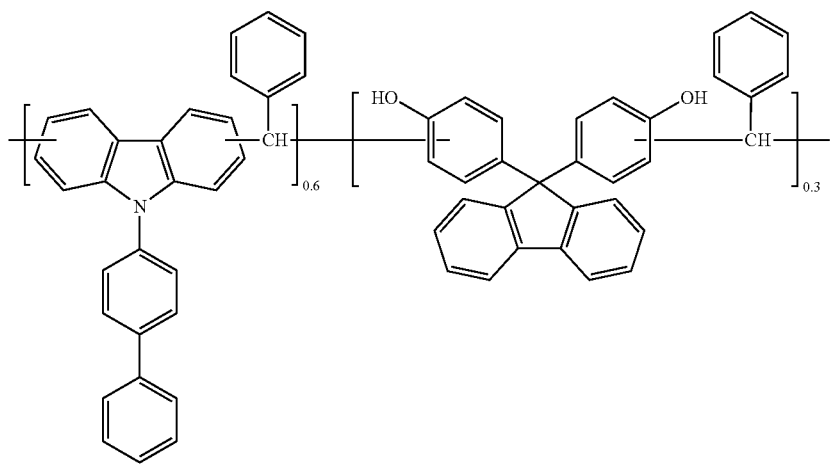

Preparation Example 6: Synthesis of Carbazole-Based Ring Polymer

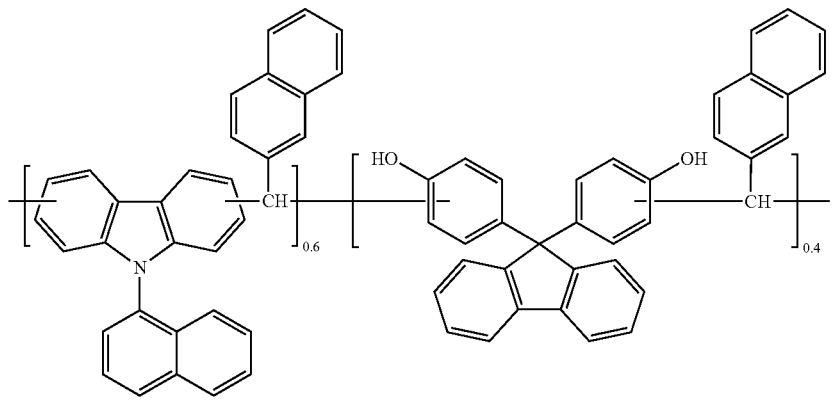

17.6 g (60 mmol) of 9-(9-naphtyl)carbazole, 16 g (100 mmol) of 2-naphthyl aldehyde, and 14 g (40 mmol) of 9,9-bishydroxyphenylfluorene were dissolved in 113 g of PGMEA, followed by adding 1 g of an undiluted sulfuric acid solution thereto.

After a polymerization reaction was carried out for 24 hours while maintaining the reactor at a temperature of about 120° C., a polymer was purified in the same manner as in Preparation Example 1 and dried in a vacuum oven, yielding the polymer having a weight average molecular weight (Mw) of 2,100.

Preparation Example 7: Synthesis of Carbazole-Based Ring Polymer

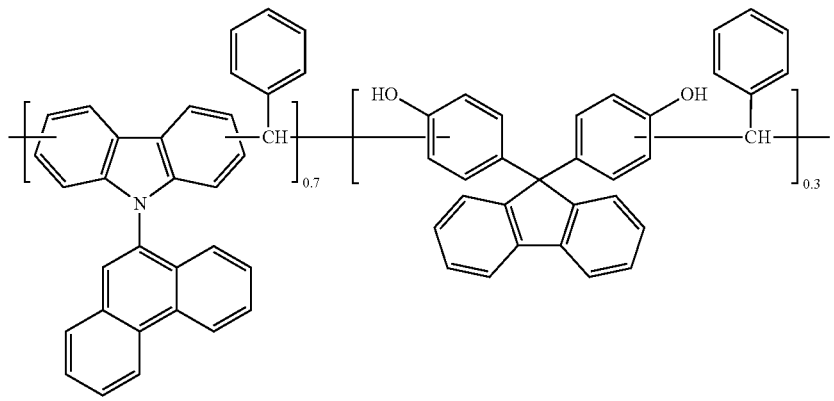

24 g (70 mmol) of 9-(9-phenanthryl)carbazole, 11 g (100 mmol) of benzaldehyde, and 11 g (30 mmol) of 9,9-bishydroxyphenylfluorene were dissolved in 110 g of PGMEA, followed by adding 1 g of an undiluted sulfuric acid solution thereto.

After a polymerization reaction was carried out in the same manner as in Preparation Example 1, a polymer was purified and dried in a vacuum oven, yielding the polymer having a weight average molecular weight (Mw) of 2,900.

Preparation Example 8: Synthesis of Carbazole-Based Ring Polymer

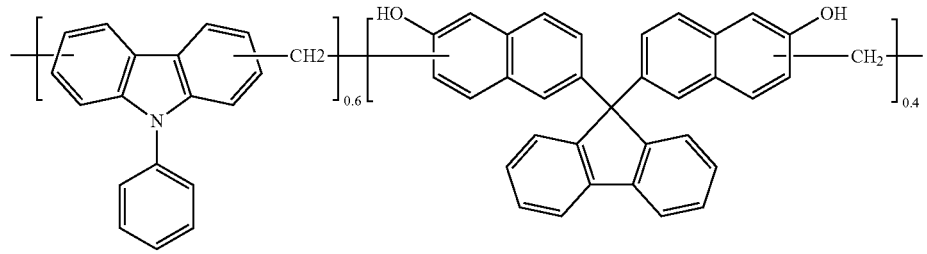

14.6 g (60 mmol) of 9-phenylcarbazole, 3.2 g (100 mmol) of paraformaldehyde, and 18 g (40 mmol) of 9,9-bis(6-hydroxy-2-naphthyl)fluorene were dissolved in 86 g of PGMEA, followed by adding 1 g of an undiluted sulfuric acid solution thereto.

After a polymerization reaction was carried out in the same manner as in Preparation Example 1, a polymer was purified and dried in a vacuum oven, yielding the polymer having a weight average molecular weight (Mw) of 2,500.

Preparation Example 9: Synthesis of Carbazole-Based Ring Polymer 16 g (50 mmol) of 9-(4-biphenyl)carbazole, 3.2 g (100 mmol) of paraformaldehyde, and 23 g (50 mmol) of 9,9-bishydroxyphenyl fluorene were dissolved in 101 g of PGMEA, followed by adding 1 g of an undiluted sulfuric acid solution thereto.

After a polymerization reaction was carried out in the same manner as in Preparation Example 1, a polymer was purified and dried in a vacuum oven, yielding the polymer having a weight average molecular weight (Mw) of 2,700.

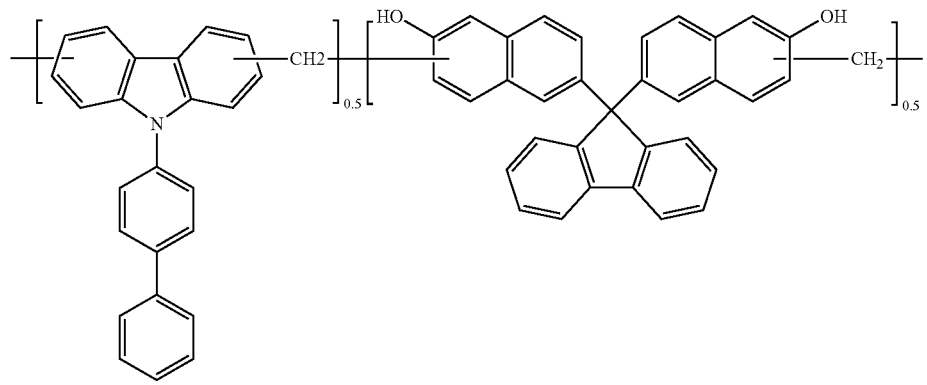

Preparation Example 10: Synthesis of Carbazole-Based Ring Polymer

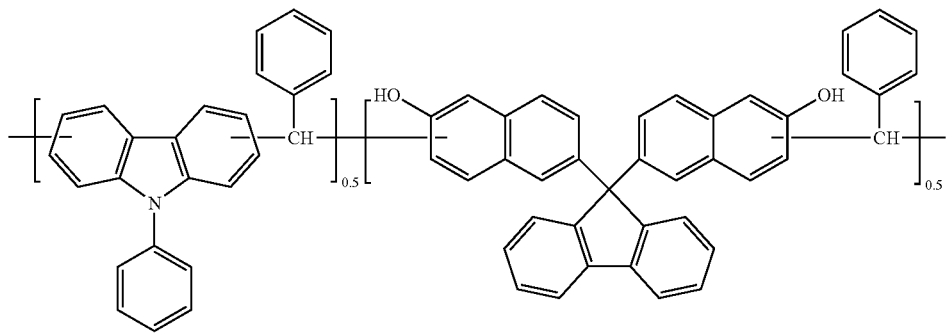

12.2 g (50 mmol) of 9-phenylcarbazole, 11 g (100 mmol) of benzaldehyde, and 23 g (50 mmol) of 9,9-bishydroxyphenyl fluorene were dissolved in 110 g of PGMEA, followed by adding 1 g of an undiluted sulfuric acid solution thereto.

After a polymerization reaction was carried out in the same manner as in Preparation Example 1, a polymer was purified and dried in a vacuum oven, yielding the polymer having a weight average molecular weight (Mw) of 2,600.

Preparation Example 11: Synthesis of Carbazole-Based Ring Polymer 20.4 g (50 mmol) of 1,3-bis(N-carbazolyl) benzene, 11 g (100 mmol) of benzaldehyde, and 18 g (50 mmol) of 9,9-bishydroxyphenyl fluorene were dissolved in 118 g of PGMEA, followed by adding 1 g of an undiluted sulfuric acid solution thereto.

After a polymerization reaction was carried out in the same manner as in Preparation Example 1, a polymer was purified and dried in a vacuum oven, yielding the polymer having a weight average molecular weight (Mw) of 2,500.

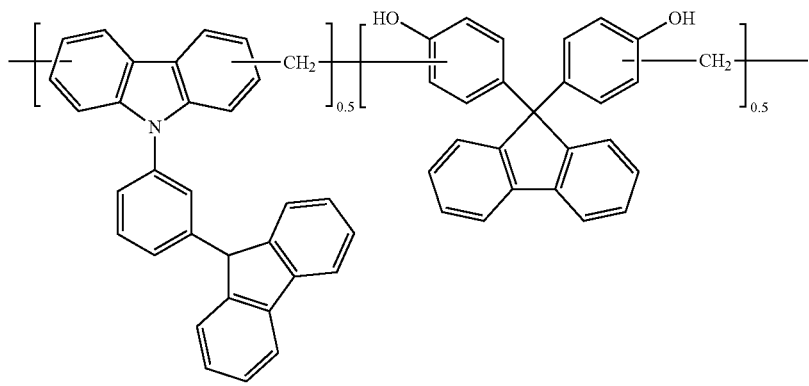

20.4 g (50 mmol) of 1,3-bis(N-carbazolyl)benzene, 3.2 g (100 mmol) of paraformaldehyde, and 18 g (50 mmol) of 9,9-bishydroxyphenyl fluorene were dissolved in 99 g of PGMEA, followed by adding 1 g of an undiluted sulfuric acid solution thereto.

After a polymerization reaction was carried out in the same manner as in Preparation Example 1, a polymer was purified and dried in a vacuum oven, yielding the polymer having a weight average molecular weight (Mw) of 2,700.

Preparation Example 12: Synthesis of Carbazole-Based Ring Polymer

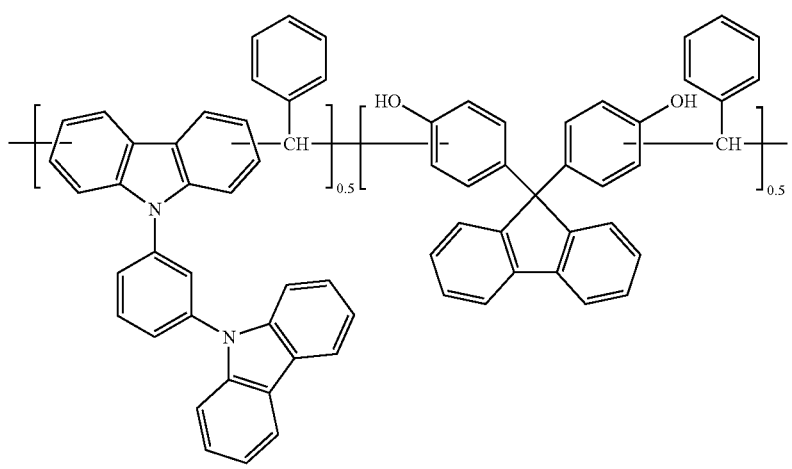

Comparative Preparation Example: Synthesis of Hydroxynaphthalene Polymer

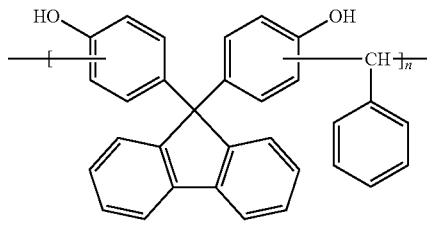

35 g (100 mmol) of 9,9-bis(4-hydroxyphenyl)fluorine and 11 g (100 mmol) of benzaldehyde were dissolved in 110 g of PGMEA, followed by adding 1 g of a concentrated sulfuric acid solution thereto.

After a polymerization reaction was carried out in the same manner as in Preparation Example 1, a polymer was purified and dried in a vacuum oven, yielding the polymer having a weight average molecular weight (Mw) of 3,100.

Preparation of Hardmask Composition 0.9 g of the polymer prepared in each of Preparation Examples 1 to 12 and Comparative Preparation Example was weighed, 0.1 g of a glycoluril compound crosslinker (Powderlink 1174) and 1 mg of pyridinium p-toluene sulfonate were dissolved in 9 g of propylene glycol monomethyl ether acetate (PGMEA) and then filtered to prepare a sample solution.

Each of the sample solutions prepared in Preparation Examples 1 to 12 and Comparative Preparation Example was spin-coated on a silicon wafer and then baked at 240° C. for 60 seconds, thereby forming a 3000 Å thick film.

The refractive index (n) and extinction coefficient (k) of each of the films were measured using an ellipsometer (J. A. Woollam Co.) and the measurement results are shown in Table 1.

The results revealed that the films had a refractive index and an absorbance suitable for use as anti-reflective coatings at 193 nm (ArF) and 248 nm (KrF) regions. The refractive indices of materials for use in semiconductor anti-reflective coatings are generally range from about 1.4 to about 1.8. More importantly, the higher the refractive index, the better the extinction coefficient. When an extinction coefficient (k) value of a composition is 0.3 or greater, the composition is preferably used for an anti-reflective coating. Therefore, it can be understood that the hardmask compositions according to embodiments of the present invention can be used for anti-reflective coatings.

TABLE 1

| Sample | Optical property (193 nm) | | Optical property (248 nm) | |
|---|---|---|---|---|
|  | Refractive index (n) | Extinction coefficient (k) | Refractive index (n) | Extinction coefficient (k) |
| Preparation Example 1 | 1.51 | 0.69 | 1.71 | 0.52 |
| Preparation Example 2 | 1.50 | 0.71 | 1.70 | 0.53 |
| Preparation Example 3 | 1.50 | 0.69 | 1.70 | 0.53 |
| Preparation Example 4 | 1.49 | 0.70 | 1.71 | 0.54 |

TABLE 1-continued

| Sample | Optical property (193 nm) | | Optical property (248 nm) | |
|---|---|---|---|---|
|  | Refractive index (n) | Extinction coefficient (k) | Refractive index (n) | Extinction coefficient (k) |
| Preparation Example 5 | 1.51 | 0.69 | 1.73 | 0.53 |
| Preparation Example 6 | 1.53 | 0.72 | 1.72 | 0.54 |
| Preparation Example 7 | 1.52 | 0.71 | 1.71 | 0.55 |
| Preparation Example 8 | 1.53 | 0.69 | 1.72 | 0.54 |
| Preparation Example 9 | 1.51 | 0.70 | 1.73 | 0.53 |
| Preparation Example 10 | 1.52 | 0.68 | 1.71 | 0.53 |
| Preparation Example 11 | 1.53 | 0.69 | 1.72 | 0.54 |
| Preparation Example 12 | 1.54 | 0.70 | 1.73 | 0.55 |
| Comparative Preparation Example | 1.48 | 0.68 | 1.95 | 0.35 |

Lithographic Evaluation of Anti-Reflective Hardmask Composition

Each of the sample solutions prepared in Preparation Examples 4, 6, 10 and 12 and Comparative Preparation Example was spin-coated on a silicon wafer and baked at 240° C. for 60 seconds to form a 3000 Å thick film.

A KrF photoresist was coated on each of the films, baked at 110° C. for 60 seconds, exposed to light using an exposure system manufactured by ASML (XT: 1400, NA 0.93), and then developed with tetramethyl ammonium hydroxide (TMAH) (2.38 wt % aqueous solution) to form a 90-nm line and space pattern, as observed using a V-SEM. The observation results are shown in Table 2 below. Exposure latitude (EL) margin according to the changes in exposure energy and depth of focus (DoF) margin according to the changes in the distance from a light source were measured and the measurement results are recorded in Table 2. As a result, the patterns showed good results in terms of profiles and margins.

TABLE 2

| Sample | Pattern properties | | |
|---|---|---|---|
|  | EL margin (ΔmJ/energy mJ) | DoF margin (μm) | Pattern profile |
| Preparation Example 4 | 0.4 | 0.4 | cubic |
| Preparation Example 6 | 0.3 | 0.3 | cubic |
| Preparation Example 10 | 0.4 | 0.3 | cubic |
| Preparation Example 12 | 0.4 | 0.4 | cubic |
| Comparative Preparation Example | 0.2 | 0.2 | undercut |

Evaluation of Etching Characteristics for Anti-Reflective Hardmask Compositions

Specimens each having a bottom SiON anti-reflective coating (BARC) were dry-etched by a photoresist (PR) as a mask using a mixed gas of CHF3/CF4 as an etching gas, and a hardmask each formed from samples in Preparation Examples 3, 5 and 11 and Comparative Preparation Example was further dry-etched by the SiON anti-reflective coating as a mask using a mixed gas of O2/N2. Thereafter, a silicon nitride (SiN) layer was dry-etched by the hardmask as a mask using a mixed gas of CHF3/CF4, and all remaining hardmask and organic materials were then removed by O2 ashing and wet stripping.

Immediately after the hardmask and the SiN layer were dry-etched, the cross sections of the specimens were observed by V-SEM and the results are shown in Table 3. The evaluation results of etching characteristics revealed that all of the patterns formed after the etching processes of the hardmask formed from samples in Preparation Examples 4, 6 and 12 and the SiN pattern had good profiles without a bowing phenomenon, confirming that the hardmask formed by the present invention had sufficiently high etching resistance and the SiN pattern has well profile.

TABLE 3

| Sample | Pattern profile (after etching hardmask) | Pattern profile (after etching SiN) |
| --- | --- | --- |
| Preparation Example 4 | Vertical | Vertical |
| Preparation Example 6 | Vertical | Vertical |
| Preparation Example 12 | Vertical | Vertical |
| Comparative Preparation Example | Slightly bowed | Bowed |

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:
1. An anti-reflective hardmask composition comprising:
   (a) a carbazole derivative polymer represented by the following Formula 1 or a polymer blend comprising the carbazole derivative polymer; and
   (b) an organic solvent:

[Formula 1]

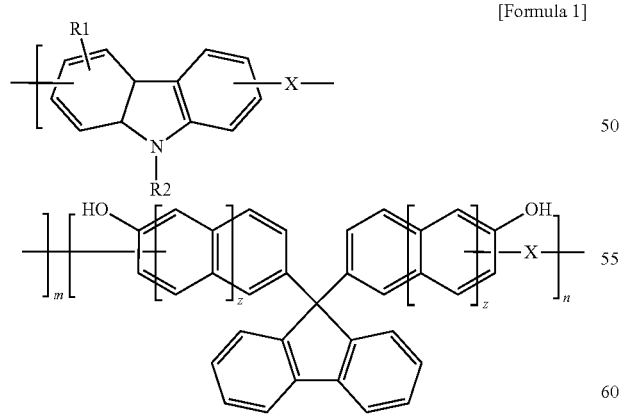

where R1 is hydrogen or an aromatic ring selected from the group consisting of the following substituents, R2 is an aromatic ring selected from the group consisting of the following substituents, and R1 and R2 may be the same or different:

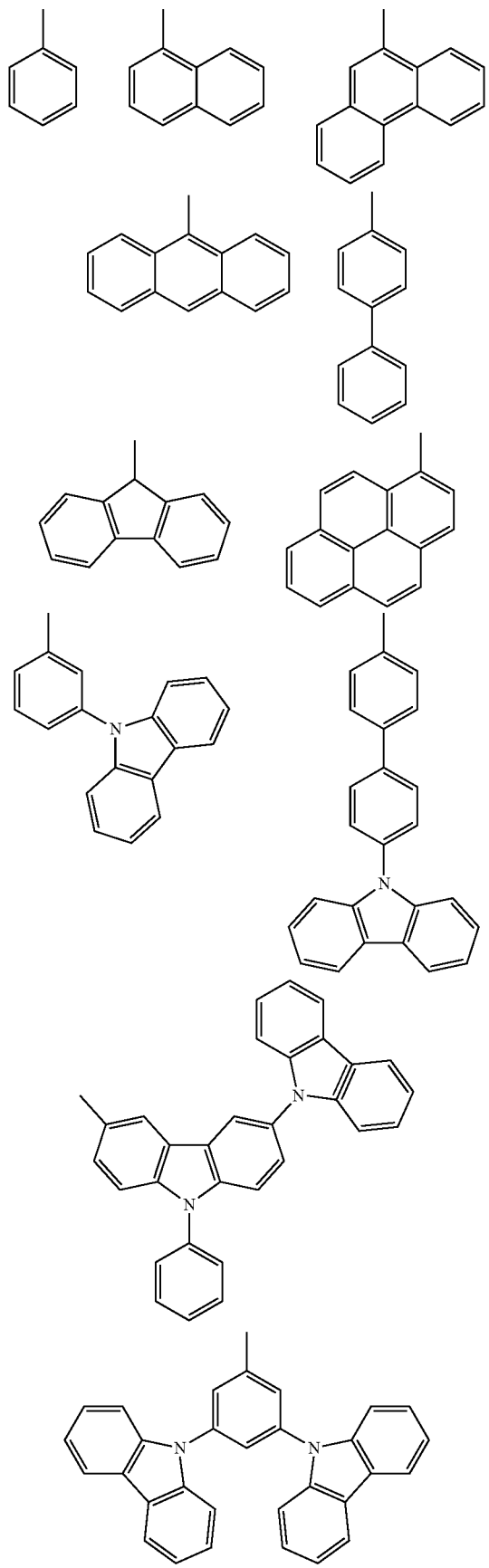

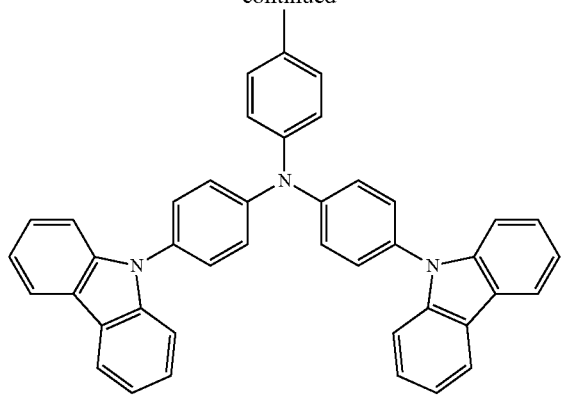

where X is at least one selected from the following substituents:

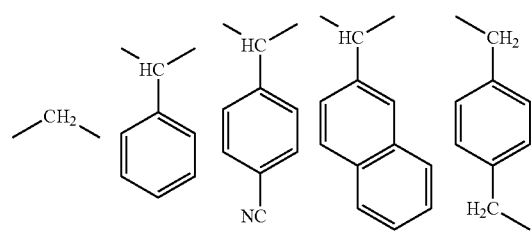

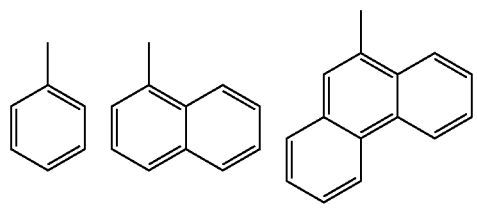

where Z is an integer of 0 or 1,
m/(m+n) equals to a value in the range of between 0.1 and 0.8, and
a weight average molecular weight (Mw) of the polymer is between 1,000 and 30,000.

2. The hardmask composition of claim 1, wherein R1 is hydrogen, R2 is at least one selected from the group consisting of the following substituents:

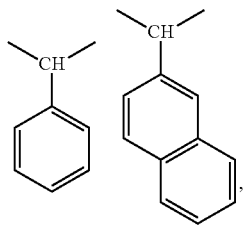

X is one selected from the group consisting of the following substituents:

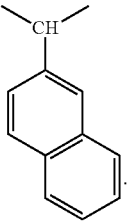

and Z is 0.

3. The hardmask composition of claim 2, wherein X is represented by:

4. The hardmask composition of claim 2, further comprising:
a crosslinker; and
an acid catalyst.

5. The hardmask composition of claim 4, wherein the crosslinker is at least one selected from the group consisting of a melamine resin, an amino resin, a glycoluril compound and a bis epoxy compound.

6. The hardmask composition of claim 4, wherein the acid catalyst is at least one selected from the group consisting of p-toluenesulfonic acid monohydrate, pyridinium p-toluene sulfonate, 2,4,4,6-tetrabromocyclohexadienone, benzoin tosylate, 2-nitrobenzyl tosylate and alkyl esters of organic sulfonic acid.

7. The hardmask composition of claim 2, comprising:
(a) 1 to 30% by weight of a polymer synthesized from the carbazole derivative or a polymer blend comprising the carbazole derivative polymer;
(b) 0.1 to 5% by weight of a crosslinker;
(c) 0.001 to 0.05% by weight of an acid catalyst; and
(d) a balance amount of an organic solvent, based on the total weight of the hardmask composition.

8. The hardmask composition of claim 1, wherein R1 is hydrogen, R2 is at least one selected from the group consisting of the following substituents:

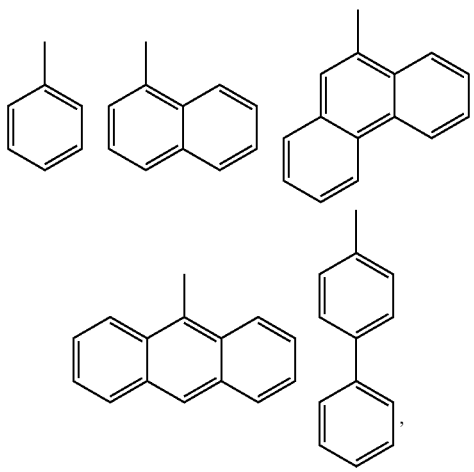

X is one selected from the group consisting of the following substituents:

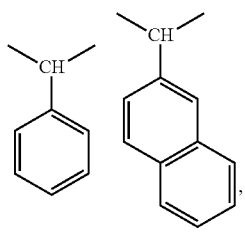

and Z is 1.

9. The hardmask composition of claim 8, wherein X is represented by:

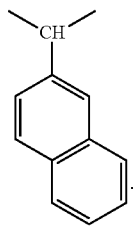

10. The hardmask composition of claim 8, further comprising:
a crosslinker; and
an acid catalyst.

11. The hardmask composition of claim 10, wherein the crosslinker is at least one selected from the group consisting of a melamine resin, an amino resin, a glycoluril compound and a bis epoxy compound.

12. The hardmask composition of claim 10, wherein the acid catalyst is at least one selected from the group consisting of p-toluenesulfonic acid monohydrate, pyridinium p-toluene sulfonate, 2,4,4,6-tetrabromocyclohexadienon, benzoin tosylate, 2-nitrobenzyl tosylate and alkyl esters of organic sulfonic acid.

13. The hardmask composition of claim 8, comprising:
(a) 1 to 30% by weight of a polymer synthesized from the carbazole derivative or a polymer blend comprising the carbazole derivative polymer;
(b) 0.1 to 5% by weight of a crosslinker;
(c) 0.001 to 0.05% by weight of an acid catalyst; and
(d) a balance amount of an organic solvent, based on the total weight of the hardmask composition.

14. The hardmask composition of claim 1, wherein X is represented by:

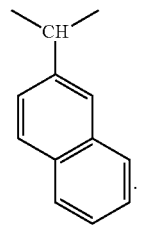

15. The hardmask composition of claim 1, further comprising:
a crosslinker; and
an acid catalyst.

16. The hardmask composition of claim 15, wherein the crosslinker is at least one selected from the group consisting of a melamine resin, an amino resin, a glycoluril compound and a bis epoxy compound.

17. The hardmask composition of claim 15, wherein the acid catalyst is at least one selected from the group consisting of p-toluenesulfonic acid monohydrate, pyridinium p-toluene sulfonate, 2,4,4,6-tetrabromocyclohexadienone, benzoin tosylate, 2-nitrobenzyl tosylate and alkyl esters of organic sulfonic acid.

18. The hardmask composition of claim 1, comprising:
(a) 1 to 30% by weight of a polymer synthesized from the carbazole derivative or a polymer blend comprising the carbazole derivative polymer;
(b) 0.1 to 5% by weight of a crosslinker;
(c) 0.001 to 0.05% by weight of an acid catalyst; and
(d) a balance amount of an organic solvent, based on the total weight of the hardmask composition.

* * * * *